(12) United States Patent
Lu

(10) Patent No.: US 6,184,117 B1
(45) Date of Patent: Feb. 6, 2001

(54) METHOD FOR REDUCING LATERAL SILICIDE FORMATION FOR SALICIDE PROCESS BY ADDITIONAL CAPPING LAYER ABOVE GATE

(75) Inventor: King Yu Lu, Hsinchu (TW)

(73) Assignee: United Microelectronics Corporation, Hsinchu (TW)

( * ) Notice: Under 35 U.S.C. 154(b), the term of this patent shall be extended for 0 days.

(21) Appl. No.: 09/115,413

(22) Filed: Jul. 14, 1998

(30) Foreign Application Priority Data

Feb. 3, 1998 (TW) .................................. 87101284

(51) Int. Cl.$^7$ ...................... H01L 21/3205; H01L 21/331
(52) U.S. Cl. ............................................. 438/592; 438/305
(58) Field of Search ..................... 438/592, 305

(56) References Cited

U.S. PATENT DOCUMENTS

| | | | |
|---|---|---|---|
| 4,877,755 | 10/1989 | Rodder | 437/200 |
| 4,912,061 | 3/1990 | Nasr | 437/44 |
| 5,034,348 | 7/1991 | Hartswick et al. | 437/200 |
| 5,118,639 | 6/1992 | Roth et al. | 437/41 |
| 5,352,631 | 10/1994 | Sitaram et al. | 437/200 |
| 5,576,227 | * 11/1996 | Hsu | 437/35 |
| 6,015,741 | * 1/2000 | Lin et al. | 438/305 |

FOREIGN PATENT DOCUMENTS

| | | |
|---|---|---|
| 60-235473 | 11/1985 | (JP) . |
| 1-300543 | 12/1989 | (JP) . |

OTHER PUBLICATIONS

Lou et al, Lateral Silicide Growth and its Suppression, pp. 715–719, Jul. 1994.*

Lou et al, Lateral Titanium Silicide Growth and its Suppression Solid State Electronics, vol. 38, 1995.*

Janmye James Sung and Ching–Yuan Lu, "Limitation of Spacer Thickness in Titanium Salicide ULSI CMOS Technology", *IEEE Electron Device Letters*, vol. 10, No. 11, Nov. 1989.

Yung–Song Lou and Ching–Yuan Wu, "Lateral Titanium Silicide Growth and its Suppression Using the a–Si/Ti Bilayer Structure", *Solid–State Electronics*, vol. 38, No. 3, pp. 715–720, 1995.

* cited by examiner

*Primary Examiner*—John F. Niebling
*Assistant Examiner*—Alexander G. Ghyka
(74) *Attorney, Agent, or Firm*—Skjerven Morrill MacPherson LLP; Alan H. MacPherson (57) ABSTRACT

A method for reducing lateral silicide formation for a salicide process in a MOS manufacturing process is disclosed. In this method, a spacer structure is formed to be higher than a polysilicon layer of a gate structure, for example by providing a capping layer above the gate structure before the formation of the spacer structure. By this way, the distance between a silicide layer subsequently formed on the gate structure and that formed on the source/drain structure can be long enough to isolate the two silicide layers, thereby preventing the short circuit resulting from the lateral growth of silicide in the MOS structure.

11 Claims, 7 Drawing Sheets

METHOD FOR REDUCING LATERAL SILICIDE FORMATION FOR SALICIDE PROCESS BY ADDITIONAL CAPPING LAYER ABOVE GATE

FIELD OF THE INVENTION

The present invention is related to a method for reducing lateral silicide formation for a salicide process in a semiconductor manufacturing process, and more particularly to a method for reducing lateral silicide formation for a salicide process in a MOS manufacturing process by lengthening a spacer beside the gate, for example by providing an additional capping layer above the gate, so as to avoid short circuit of the device resulting from the lateral silicide formation.

BACKGROUND OF THE INVENTION

A self-aligned process for forming a silicide layer is popularly used in a semiconductor manufacturing process, and especially commonly used in an MOS process. The self-aligned process can be advantageously used to produce a self-aligned silicide layer, or "salicide" for short, of low resistivity on the surface of a silicon or a polysilicon layer. Moreover, no petty photolithography procedure is required in this process. For a VLSI process to produce a device of a reduced size and/or a deep-submicron level, such a contact metallization process has great potentiality.

Figure 1A:
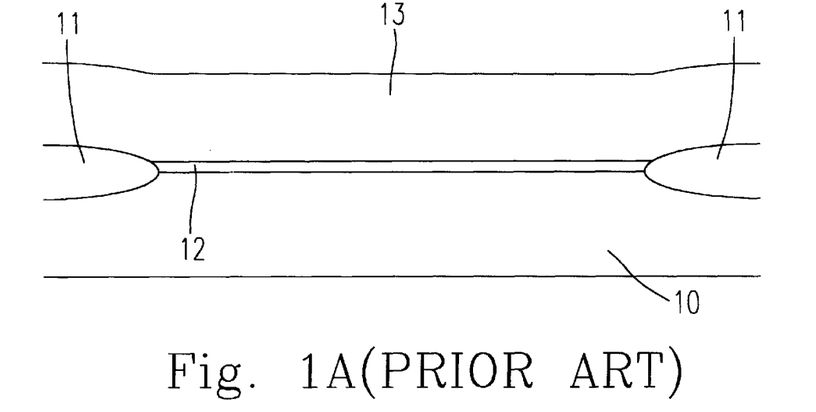
FIGS. 1A~1F schematically show a conventional process for forming a self-aligned silicide in an MOS manufacturing process.
Figure 1B:
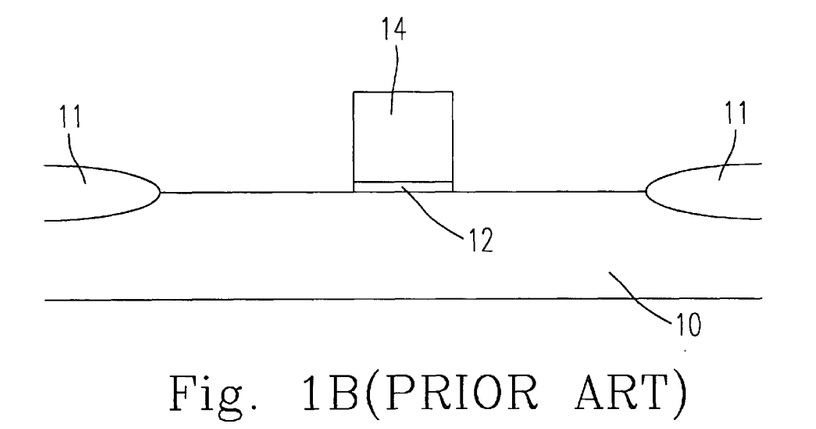
Figure 1C:
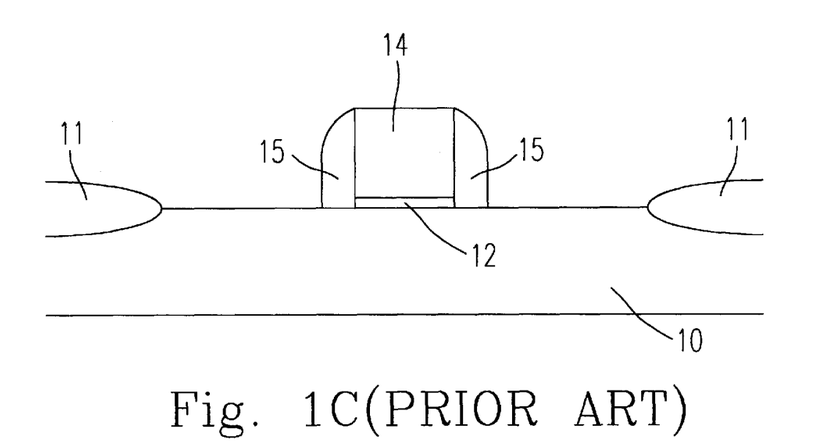
Figure 1D:
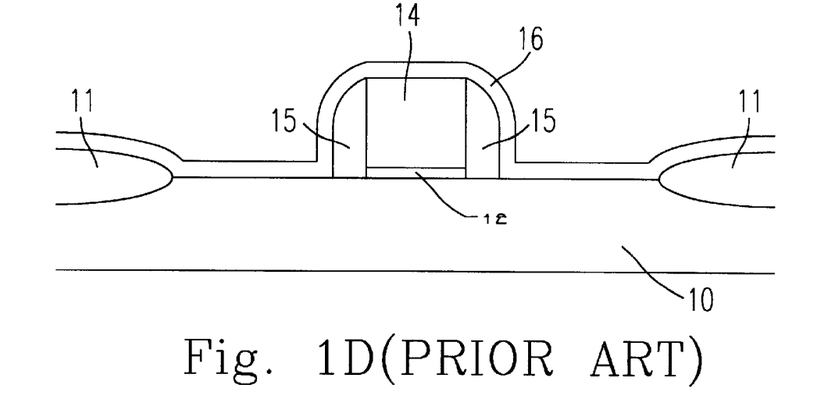
Figure 1E:
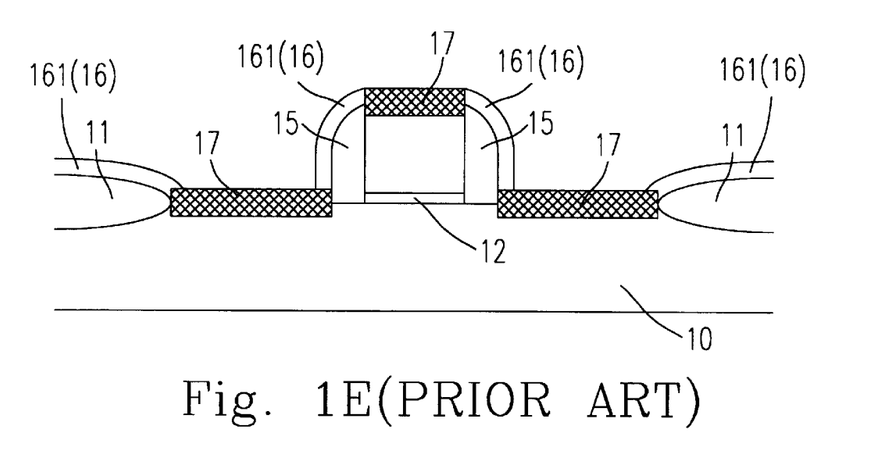
Figure 1F:
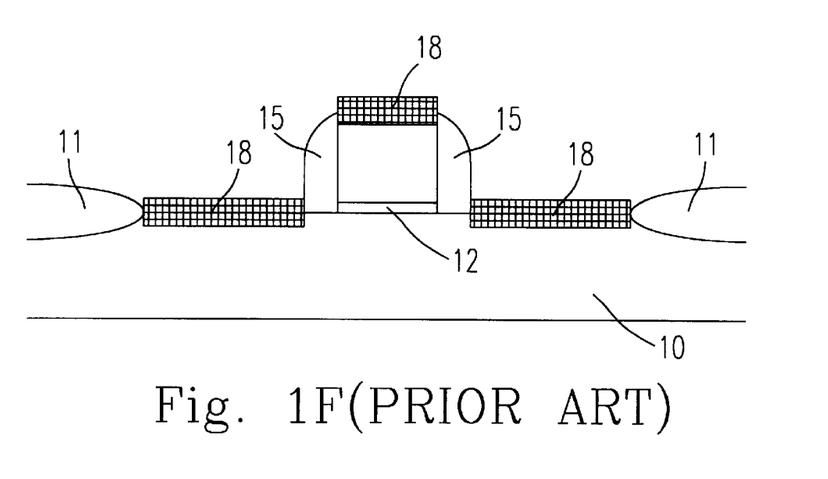

Please refer to FIGS. 1A~1F which schematically show a conventional process for forming a self-aligned silicide in an MOS manufacturing process. In many cases, titanium is used as the metal for forming the self-aligned silicide. FIG. 1A schematically shows the formation of a polysilicon layer 13 over a silicon substrate 10 having been formed thereon a field oxide 11 and a gate oxide 12. FIG. 1B schematically shows the step of defining a gate 14 for the structure of FIG. 1A. FIG. 1C schematically shows the deposition of an oxide layer which is further etched to form a spacer 15 on the structure of FIG. 1B. This deposition procedure can be a chemical vapor deposition (CVD) process. FIG. 1D schematically shows the deposition of a titanium metal layer 16 on the resulting structure of FIG. 1C. In this procedure, the metal layer 16 can be deposited by a sputtering process. FIG. 1E schematically shows the formation of a titanium silicide ($TiSi_2$) layer 17 of C49 phase. The layer 17 is formed by a rapid thermal process (RTP), wherein portions of the titanium metal 16 react with the silicon 10 of the source and drain regions, and the polysilicon 14 of the gate region thereunder at a high temperature of 650° C. with the introduction of a nitrogen gas. FIG. 1F schematically shows the transformation of the undesired C49-phase $TiSi_2$ layer 17 into a desired C54-phase $TiSi_2$ layer 18 which has a lower resistivity. Before the formation of the $TiSi_2$ layer 18, the primitive titanium metal 16 which does not react with silicon or polysilicon, or the titanium nitride 161 produced by the reaction between the titanium metal and the introduced nitrogen are removed by selectively etching. Then, another rapid thermal process is performed at an even higher temperature of 825° C. with the introduction of nitrogen to form the $TiSi_2$ layer 18 so as to complete the formation of the salicide of the gate in the MOS manufacturing process.

Figure 2:
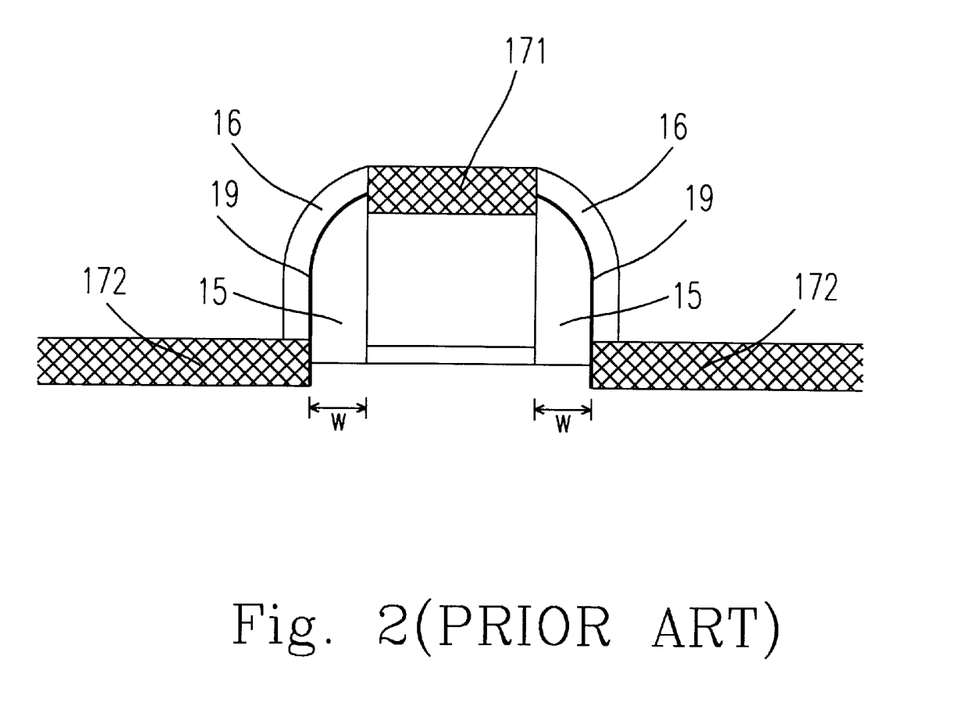
FIG. 2 schematically shows that silicon atoms in the silicon layer of the source/drain region, and the polysilicon layer of the gate region diffuse along the interface between the titanium metal layer and the spacer due to the high temperature of the thermal process.

In the self-aligned step shown in FIG. 1E of the conventional process, silicon atoms of the silicon 10 of the source and drain regions, and the polysilicon 14 of the gate region are likely to diffuse along the interface 19 (FIG. 2) between the unreacted titanium metal layer 16 and the spacer 15 due to the high temperature of the thermal process. As such, referring to FIG. 2, the width W of the spacer 15 should be enlarged to assure of enough length the spacer between the silicide 171 in the gate region and the silicide 172 in the source/drain region, thereby preventing the reaction between the titanium metal and the diffusing silicon atoms to cause the lateral growth of the silicide. As known to those skilled in the art, excessive lateral growth of the silicide takes a risk of short circuit, and seriously influences the yield of the process. Unfortunately, the enlargement of the spacer width does not comply with the current requirement in size reduction and may degrade the device. For example, the width of the spacer has certain effect on the domain of the lightly doped drain (LDD), and should be at a preferably specific value.

In order to avoid the above problems, a technique is proposed by Y. S. Lou and C. Y. Wu, and disclosed in a treatise entitled, "Lateral Titanium Silicide Growth and Its Suppression Using the Amorphous Si/Ti Bilayer Structure", *Solid State Electronics*, Vol. 38, pp. 715~720, 1995. According to this technique, an amorphous Si layer is used to isolate the titanium from the external oxygen impurities, and closely monitoring on the process conditions is performed to inhibit the adverse effect of the internal oxygen impurities on the growth of the lateral titanium silicide. This technique does have prominent effect on the suppression of the lateral growth of titanium silicide if the entering of the oxygen impurities into the titanium metal in the process is precisely controlled. Unfortunately, titanium is a good oxygen-gettering metal so that the isolation of the titanium metal from the oxygen impurities will be difficult. If the result described in the treatise is to be achieved, the cost for the equipment and the process control will be extremely high.

SUMMARY OF THE INVENTION

An object of the present invention is to provide a method for reducing lateral silicide formation for a salicide process in an MOS manufacturing process, thereby avoiding short circuit of the MOS device, which results from the lateral growth of the self-aligned silicide.

The present invention is related to a method for reducing lateral silicide formation for a salicide process in an MOS manufacturing process. The method includes steps of a) providing a silicon substrate; b) forming a field oxide structure on the silicon substrate; c) forming a gate oxide layer on the silicon substrate within the field oxide structure; d) overlying a polysilicon layer on the resulting silicon substrate; e) removing a portion of the polysilicon layer to form a gate structure; f) forming a spacer structure beside the gate structure, the spacer structure having a level higher than a top surface of the polysilicon layer; and g) performing the salicide process.

Preferably, the spacer can be formed to be higher than the polysilicon layer by forming a capping layer on the polysilicon layer, removing a portion of the capping layer together with the portion of the polysilicon layer when the gate structure is defined, and then removing the residual capping layer after the spacer structure in formed.

The material constituting the capping layer can be silicon nitride ($Si_3N_4$), phosphosilicate glass (PSG), titanium nitride (TiN), or the like. For different capping materials, different capping-layer removing processes are used in order to have optimal performance.

For example, when the capping layer is composed of silicon nitride ($Si_3N_4$), the first portion of the capping layer is removed by a reactive ion etching process using a fluorine-based gas selected from a group consisting of trifluoromethane ($CHF_3$), hexafluoroethane ($C_2F_6$), trifluoromethane ($CHF_3$)/nitrogen monoxide ($N_2O$), and carbon tetrafluoride ($CF_4$)/hydrogen ($H_2$). After the spacer structure is formed, the residual capping layer is removed by a selective etching process using a solution consisting of phosphoric acid ($H_3PO_4$) and hydrogen peroxide ($H_2O_2$).

When the capping layer is composed of phosphosilicate glass (PSG), the first portion of the capping layer is removed by a reactive ion etching process using a fluorine-based gas selected from a group consisting of trifluoromethane ($CHF_3$), hexafluoroethane ($C_2F_6$), trifluoromethane ($CHF_3$)/nitrogen monoxide ($N_2O$), and carbon tetrafluoride ($CF_4$)/hydrogen ($H_2$). After the spacer structure is formed, the residual capping layer is removed by a selectively etching process using a hydrogen fluoride vapor.

When the capping layer is composed of titanium nitride (TiN), the first portion of the capping layer is removed by a reactive ion etching process using a chlorine-based gas selected from a group consisting of chlorine ($Cl_2$), boron trichloride ($BCl_3$), carbon tetrachloride ($CCl_4$), silicon tetrachloride ($SiCl_4$), hydrogen chloride (HCl) and phosphorus trichloride ($PCl_3$). After the spacer structure is formed, the residual capping layer is removed by a selectively etching process using an admixture consisting of ammonium hydroxide ($NH_4OH$), hydrogen peroxide ($H_2O_2$) and water ($H_2O$).

In accordance with another aspect of the present invention, the spacer structure is preferably formed of silicon dioxide ($SiO_2$), and the spacer structure is higher than the polysilicon layer by a length ranging between about 500 Å and about 2000 Å.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3A:
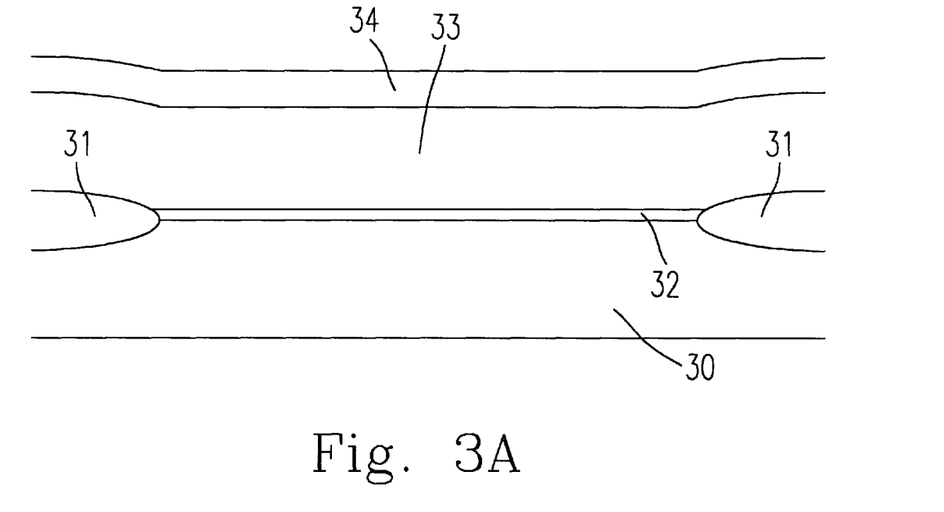
FIGS. 3A~3G schematically show a self-aligned process for forming titanium silicide in an MOS structure according to the present invention.
Figure 3B:
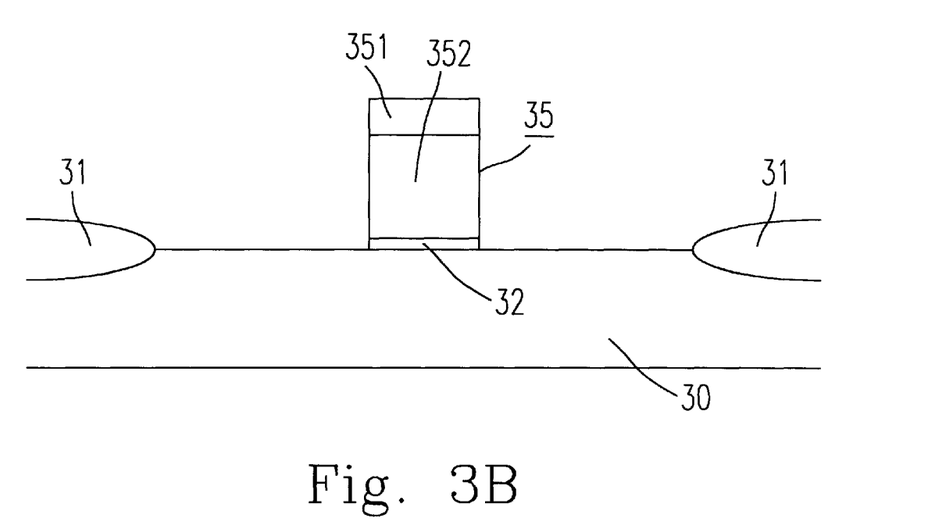
Figure 3C:
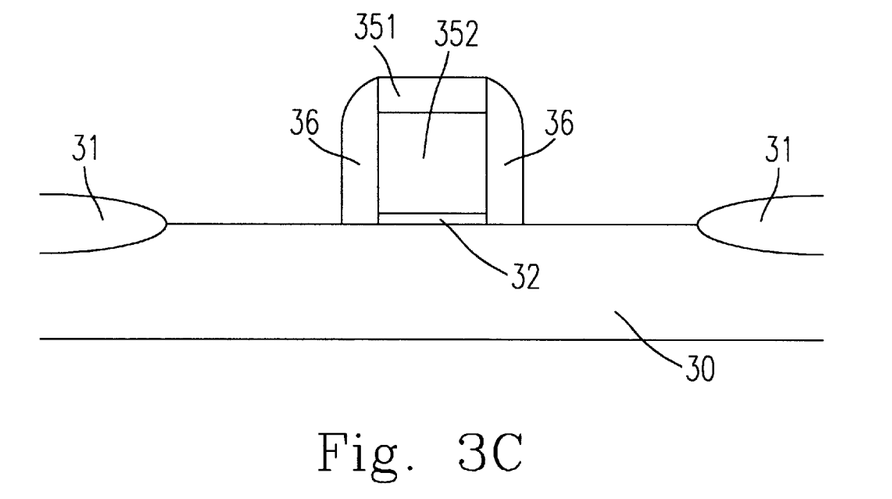
Figure 3D:
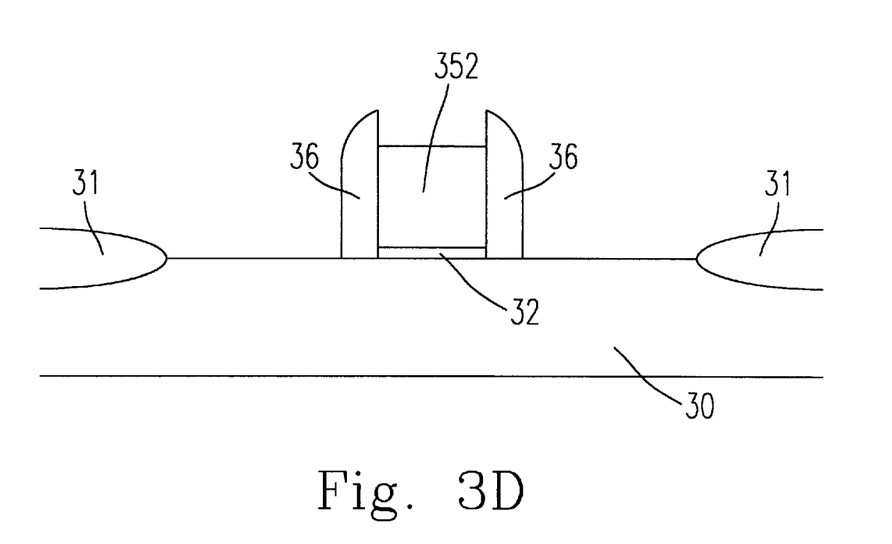
Figure 3E:
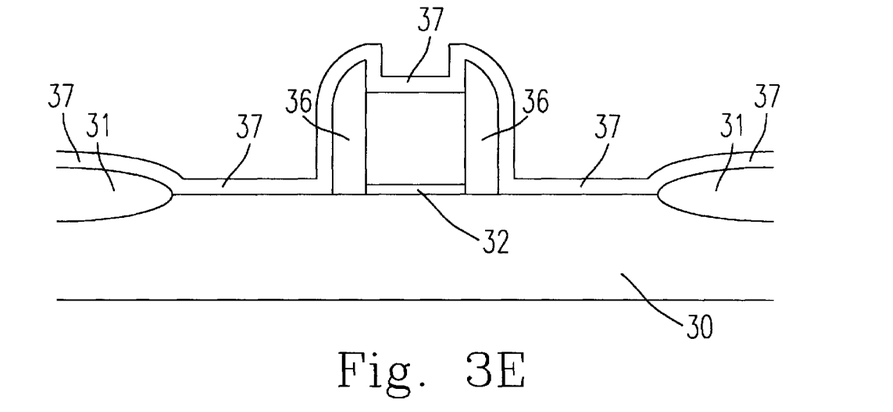
Figure 3F:
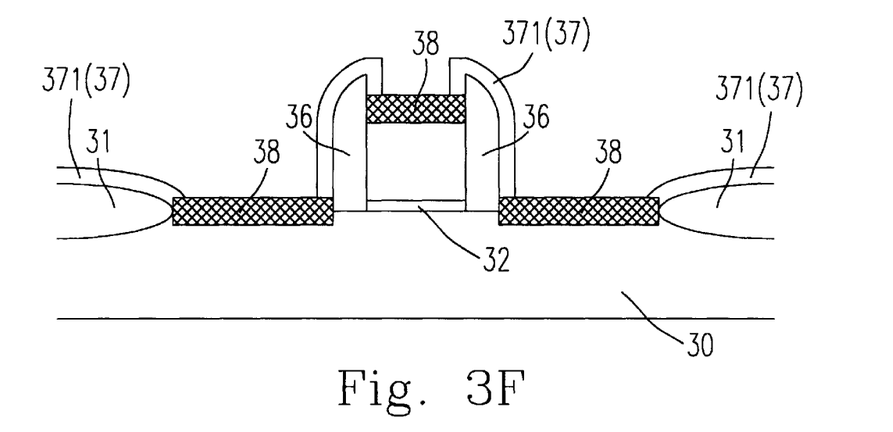
Figure 3G:
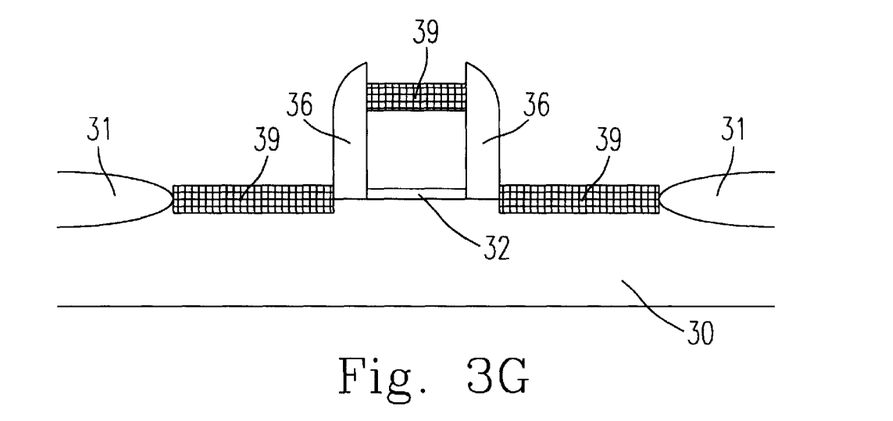

Please refer to FIGS. 3A~3G which schematically show a self-aligned process for forming titanium silicide in an MOS structure according to the present invention. FIG. 3A schematically shows that a polysilicon layer 33 is formed over a silicon substrate 30 having formed thereon a field oxide 31 and a gate oxide 32, and then a silicon nitride layer 34 is formed on the polysilicon layer 33 as a capping layer. FIG. 3B schematically shows a gate structure 35 which is defined by a microlithographic process to remove portions of the polysilicon layer 33 and the silicon nitride layer 34 so as to leave for the gate structure 35 of residual layers of polysilicon 352 and silicon nitride 351. The removal of the portion of the silicon nitride layer 34 is performed by a reactive ion etching process using a fluorine-based gas selected from a group consisted of trifluoromethane ($CHF_3$), hexafluoroethane ($C_2F_6$), trifluoromethane ($CHF_3$)/nitrogen monoxide ($N_2O$), and carbon tetrafluoride ($CF_4$)/hydrogen ($H_2$). On the other hand, the portion 35 of the polysilicon layer 33 is formed by an anisotropic etching process. FIG. 3C schematically shows that a spacer structure 36 is formed beside the gate structure 35. The spacer structure 36 is formed by depositing a silicon dioxide layer on the resulting structure of FIG. 3B by a chemical vapor deposition process, and then etching the oxide layer. FIG. 3D schematically shows that the residual silicon nitride layer 351 of the structure of FIG. 3C is removed so as to make the spacer structure 36 have a level higher than a top surface of the polysilicon layer 352. The residual silicon nitride layer 351 is removed by a selective etching process using a solution consisting of phosphoric acid ($H_3PO_4$) and hydrogen peroxide ($H_2O_2$). FIG. 3E schematically shows that a titanium metal layer 37 is deposited on the resulting structure of FIG. 3D. The titanium metal layer 37 is deposited by a sputtering process. FIG. 3F schematically shows the formation of a titanium silicide ($TiSi_2$) layer 38 of C49 phase. The layer 38 is formed by a rapid thermal process (RTP), wherein portions of the titanium metal 37 react with the silicon 30 of the source and drain regions, and the polysilicon 34 of the gate region thereunder at a high temperature of 650° C. with the introduction of a nitrogen gas. FIG. 3G schematically shows the transformation of the undesired C49-phase $TiSi_2$ layer 38 into a desired C54-phase $TiSi_2$ layer 39 which has a lower resistivity. Before the formation of the $TiSi_2$ layer 39, the primitive titanium metal 37 which does not react with silicon or polysilicon, or the titanium nitride 371 produced by the reaction between the titanium metal and the introduced nitrogen are removed by selective etching. Then, another rapid thermal process is performed at an even higher temperature of 825° C. with the introduction of nitrogen to form the $TiSi_2$ layer 39 so as to complete the formation of the salicide of the gate in the MOS manufacturing process.

In another preferred embodiment according to the present invention, the procedures are similar to those of the above embodiment except that a phosphosilicate glass layer rather than the silicon nitride layer serves as the capping layer 34, and thus a different etchant is used for removing the capping layer. When the capping layer 34 is composed of phosphosilicate glass, the removal of the first portion of the capping layer for forming the gate structure 35 is performed by a reactive ion etching process using a fluorine-based gas selected from a group consisting of trifluoromethane ($CHF_3$), hexafluoroethane ($C_2F_6$), trifluoromethane ($CHF_3$)/nitrogen monoxide ($N_2O$), and carbon tetrafluoride ($CF_4$)/hydrogen ($H_2$). After the spacer structure 36 is formed, the residual capping layer 351 is removed by a selective etching process using a hydrogen fluoride vapor.

In a further preferred embodiment according to the present invention, the procedures are similar to those of the above embodiments except that a titanium nitride layer rather than the silicon nitride layer serves as the capping layer 34, and thus a different etchant is used for removing the capping layer. When the capping layer 34 is composed of titanium nitride, the removal of the first portion of the capping layer for forming the gate structure 35 is performed by a reactive ion etching process using a chlorine-based gas selected from a group consisting of chlorine ($Cl_2$), boron trichloride ($BCl_3$), carbon tetrachloride ($CCl_4$), silicon tetrachloride ($SiCl_4$), hydrogen chloride (HCl) and phosphorus trichloride ($PCl_3$). After the spacer structure is formed, the residual capping layer is removed by a selective etching process using an admixture consisting of ammonium hydroxide ($NH_4OH$), hydrogen peroxide ($H_2O_2$) and water ($H_2O$).

According to the present invention, the spacer structure 36 can be lengthened owing to the provision of the capping layer 34 before the formation of the spacer structure 36. By this way, referring to FIGS. 4A and 4B, the spacer structure 36 can be higher than the polysilicon layer 352 by a certain length H which depends on the thickness of the capping layer 34. In other words, the spacer can be assured of enough length between the silicide 381 in the gate region and the silicide 382 in the source/drain region without undesirely changing the width W of the spacer structure 36. Practically, the length H is preferably ranged between about 500 Å and about 2000 Å.

Figure 4A:
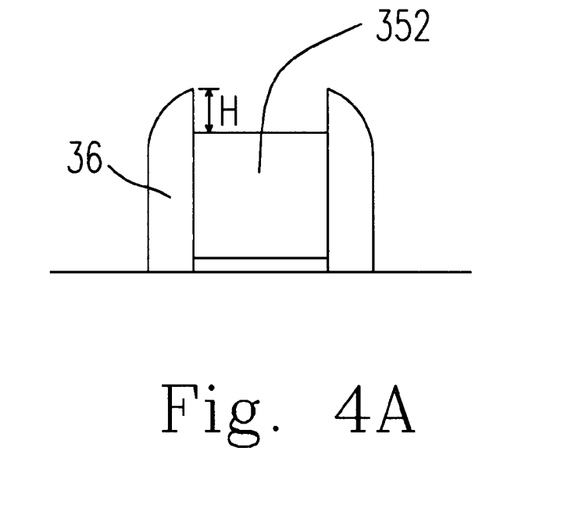
FIGS. 4A and 4B schematically show the lengthening of the spacers for avoiding short circuit resulting from the possible lateral growth of the self-aligned silicide.
Figure 4B:
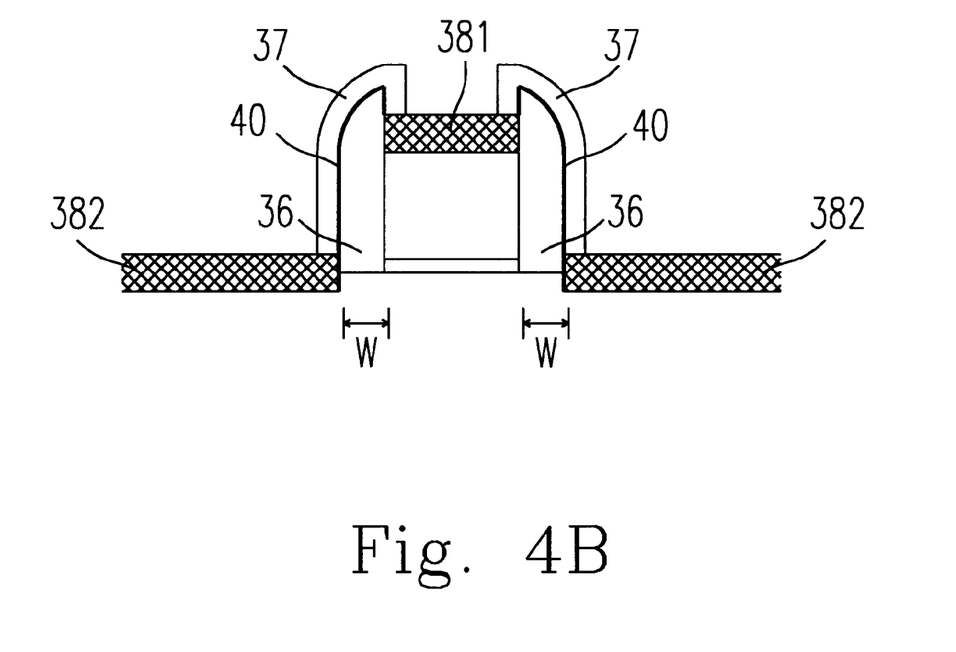

Therefore, silicon atoms of the silicon of the source and drain regions, and the polysilicon of the gate region diffusing along the interface 40 between the unreacted titanium metal layer 37 and the spacer 36 due to the high temperature of the thermal process have to travel a longer distance to react with titanium atoms and connect together. As such, the lateral formation of the titanium silicide during the salicide process can be greatly reduced, and in other words, the short circuit resulting from the lateral growth of the titanium silicide can be inhibited.

While the invention has been described in terms of what are presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for reducing lateral silicide formation for a salicide process in an MOS manufacturing process, comprising steps of:
    a) providing a silicon substrate having thereon field oxide and gate oxide;
    b) overlying a polysilicon layer on the resulting silicon substrate;
    c) forming a capping layer on said polysilicon layer, said capping layer being formed of a material selected from a group consisting of silicon nitride ($Si_3N_4$), phosphosilicate glass (PSG) and titanium nitride (TiN);
    d) removing portions of said polysilicon layer and said capping layer to form a gate structure with a residual capping layer thereon;
    e) forming a spacer structure beside said gate structure and said residual capping layer;
    f) removing said residual capping layer after said spacer structure is formed so that said spacer structure has a level higher than a top surface of said polysilicon layer; and
    g) performing said salicide process.

2. The method as claimed in claim 1 wherein said capping layer is formed of silicon nitride ($Si_3N_4$), and in said step d), said portion of said capping layer is removed by a reactive ion etching process using a fluorine-based gas selected from the group consisting of trifluoromethane ($CHF_3$), hexafluoroethane ($C_2F_6$), trifluoromethane ($CHF_3$)/nitrogen monoxide ($N_2O$), and carbon tetrafluoride ($CF_4$)/hydrogen ($H_2$).

3. The method as claimed in claim 2 wherein said spacer structure is formed of silicon dioxide ($SiO_2$).

4. The method as claimed in claim 3 wherein in said step f), said residual capping layer is removed by a selective etching process using a solution consisting of phosphoric acid ($H_3PO_4$) and hydrogen peroxide ($H_2O_2$).

5. The method as claimed in claim 1 wherein said capping layer is formed of phosphosilicate glass (PSG), and in said step d), said portion of said capping layer is removed by a reactive ion etching process using a fluorine-based gas selected from the group consisting of trifluoromethane ($CHF_3$), hexafluoroethane ($C_2F_6$), trifluoromethane ($CHF_3$)/ nitrogen monoxide ($N_2O$), and carbon tetrafluoride ($CF_4$)/ hydrogen ($H_2$).

6. The method as claimed in claim 5 wherein said spacer structure consists of silicon dioxide ($SiO_2$).

7. The method as claimed in claim 6 wherein in said step f), said residual capping layer is removed by a selective etching process using a hydrogen fluoride vapor.

8. The method as claimed in claim 1 wherein said capping layer is formed of titanium nitride (TiN), and in said step d), said portion of said capping layer is removed by a reactive ion etching process using a chlorine-based gas selected from the group consisting of chlorine ($Cl_2$), boron trichloride ($BCl_3$), carbon tetrachloride ($CCl_4$), silicon tetrachloride ($SiCl_4$), hydrogen chloride (HCl) and phosphorus trichloride ($PCl_3$).

9. The method as claimed in claim 8 wherein said spacer structure is formed of silicon dioxide ($SiO_2$).

10. The method as claimed in claim 9 wherein in said step f), said residual capping layer is removed by a selective etching process using an admixture consisting of ammonium hydroxide ($NH_4OH$), hydrogen peroxide ($H_2O_2$) and water ($H_2O$).

11. The method as claimed in claim 1 wherein said spacer structure is higher than said polysilicon layer by a length ranging between about 500 Å and about 2000 Å.

* * * * *